United States Patent [19]

Marshall

[11] Patent Number: 5,134,621
[45] Date of Patent: Jul. 28, 1992

[54] HIGH GAIN SEMICONDUCTOR LASER AMPLIFIER PACKAGE

[75] Inventor: Ian W. Marshall, Woodbridge, England

[73] Assignee: British Telecommunications public limited company, London, England

[21] Appl. No.: 613,564

[22] PCT Filed: Apr. 25, 1990

[86] PCT No.: PCT/GB90/00632

§ 371 Date: Nov. 28, 1990

§ 102(e) Date: Nov. 28, 1990

[87] PCT Pub. No.: WO90/13163

PCT Pub. Date: Nov. 1, 1990

[30] Foreign Application Priority Data

Apr. 25, 1989 [GB] United Kingdom ............ 8909362

[51] Int. Cl.$^5$ ................................................ H01S 3/30
[52] U.S. Cl. ........................................ 372/8; 372/6; 372/19; 372/25; 372/703; 359/333; 359/195; 359/181
[58] Field of Search .................. 372/8, 18, 19, 25, 6, 372/703; 350/96.15, 96.17, 96.18; 330/4.3; 357/16, 17; 455/601, 602, 609, 610, 611

[56] References Cited

U.S. PATENT DOCUMENTS

| | | | |
|---|---|---|---|
| 4,101,845 | 7/1978 | Russer | 372/50 X |
| 4,635,263 | 6/1987 | Mollenauer | 372/3 |
| 4,755,016 | 7/1988 | Deloach, Jr. et al. | 350/96.16 |
| 4,764,930 | 8/1988 | Bille et al. | 372/23 |
| 4,862,467 | 8/1989 | Carter et al. | 372/18 |
| 4,910,738 | 3/1990 | Fujita | 372/18 |
| 4,922,497 | 5/1990 | Mori et al. | 372/8 |
| 4,962,507 | 10/1990 | Adams | 372/8 |
| 4,979,234 | 12/1990 | Agrowal et al. | 455/608 |
| 5,007,735 | 4/1991 | Calvani et al. | 356/128 |

FOREIGN PATENT DOCUMENTS

| | | |
|---|---|---|
| 56-64487 | 6/1981 | Japan . |
| 63-97026 | 4/1988 | Japan . |
| 63-125919 | 5/1988 | Japan . |
| 63-219186 | 9/1988 | Japan . |

OTHER PUBLICATIONS

Olsson et al., "Spectral Shift and Distortion Due to ...", Applied Physics Lett., vol. 55(1), 3 Jul. 1989, pp. 13-15.

Oberg et al., "313 Km Transmission Experiment of 1 Gbit/s ...", Electron. Lett., vol. 24(1), 7 Jan. 1988, pp. 38-39.

Kawaguchi et al., "Optical Frequency-Selective Amplification ...", Appl. Phys. Lett., vol. 50(2), 12 Jan. 1987, pp. 66-67.

Ikeda, M., "Signal-Monitoring Characteristics for Laser ...", J. Lightwave Technol., vol. LT-3(4), Aug. 1985, pp. 909-913.

Öberg et al., "Crosstalk Between Intensity-Modulated ...", IEEE J. Quant. Electron., vol. QE-24(1) Jan. 1988, pp. 52-.

Hasagawa et al., "Amplification and Reshaping of Optical ...", Opt. Lett., vol. 7(6) Jun. 1982, pp. 285-287.

"ASK Heterodyne Receiver Sensitivity Measurements With Two In-Line 1.5 μm Optical Amplifiers", *Electronics Letters*, 7th Nov. 1985, vol. 21, No. 23.

"Optical System With Two Packaged 1.5 μm Semiconductor Laser Amplifier Repeaters", *Electronics Letters*, 27 Nov. 1986, vol. 22, No. 5, pp. 253-255.

*Primary Examiner*—Georgia Y. Epps
*Attorney, Agent, or Firm*—Nixon & Vanderhye

[57] ABSTRACT

A laser amplifier package comprises two laser amplifiers coupled via two lenses and an optical isolator. The first and second laser amplifiers may both be run as amplifiers to give an overall improved gain and reduced residual facet reflectivity. The first amplifier may be run as a pulse source as part of an LEC or gain switched DFB laser assembly. Pulses generated to be, or compressed to, near transform limited enable the output from the package to be optical solitons. The second laser amplifier may be switched to provide modulation.

23 Claims, 2 Drawing Sheets

HIGH GAIN SEMICONDUCTOR LASER AMPLIFIER PACKAGE

FIELD OF THE INVENTION

This invention relates to high gain semiconductor laser amplifiers, and more particularly to the combination of two such laser amplifiers.

BACKGROUND AND SUMMARY OF THE INVENTION

Travelling wave semiconductor laser amplifiers have been proposed for a number of optical communications applications. They have been used, for example, as repeaters, preamplifiers, power boosters, switches and filters. Many of these applications rely on high gain to achieve optimum performance and a critical factor in achieving high saturated output power is minimising residual facet reflectivity. Up to the present time, only limited gains of around 20 dB have been demonstrated, and it has not yet proved possible to improve on this due to the difficulty in reducing residual facet reflectivity.

The present invention is directed in a first aspect towards tackling both of these problems, and producing a laser amplifier package having higher gain than previously achieved.

When a pulsed optical signal is propagated along an optical fibre link there is usually pulse spreading due to dispersion and thus it is necessary to regenerate the signal at repeaters spaced along the link. However it is possible to propagate optical pulses along an optical fibre without significant dispersion, if the pulses are optical solitons, and in that case very long transmission distances without regeneration becomes possible. Optical solitons are relatively high peak power (e.g. 100 mW), short duration (e.g. 3 ps) pulses of smooth profile. Generation of optical solitons is at present achieved utilising cryogenic lasers and the equipment is large and expensive. See, for example, U.S. Pat. No. 4,635,263, in which a colour centre laser is used as a pulse source.

The present invention in a second aspect is directed towards the production of optical solitons utilising semiconductor laser amplifiers.

Another aspect of the invention is directed towards modulation techniques for use in the first and second aspects of the invention.

Accordingly a first aspect of the present invention provides a laser amplifier package comprising two semiconductor laser amplifiers coupled in series via two lenses forming a collimated beam section and an optical isolator.

In its second aspect the first amplifier may be driven as a pulse source as part of a long-external-cavity (LEC) or gain switched DFB laser assembly. The pulses may be made near transform limited (see chapter 9 of 'Lasers', by Anthony E. Siegman, Oxford University Press, 1986, in particular pages 334–335) at generation or by compression and the amplification sufficient to produce optical solitons.

In the third aspect the second laser amplifier is switched to modulate the output of the package.

BRIEF DESCRIPTION OF THE DRAWINGS

A more detailed description of a specific embodiment of the invention will now be described by way of example with reference to the accompanying drawings in which.

DETAILED DESCRIPTION OF THE DRAWINGS

Very surprisingly, we have discovered that when two laser amplifiers are aligned in series, as little as 20 dB of optical isolation may be sufficient to prevent the backward amplified wave (signal and spontaneous) from the second amplifier affecting the first. Previously it was believed that, if one were to put two laser amplifiers in series, in order to prevent interaction one would need to reduce the level of back spontaneous emission which would typically be about 1 mW) to about 10 percent of the signal level. To do this would typically require 40 dB of isolation.

What we have discovered is that the critical factor is not back-spontaneous emission, but is the returned signal level. Because of the influence of the amount of gain provided by the second device on the level of reflected signal, the loss which needs to be provided by the isolator is related to the gain of the second device. A signal reflected from the remote facet of the second device is typically 30 dB down, so with a 20 dB gain device, a 20 dB isolator gives an overall 10 dB loss (i.e. in the second device the forward signal gain is 20 dB, there is a 30 dB loss on reflection, than a 20 dB gain for the reflected signal, which is a total of 10 dB gain, then 20 dB loss through the isolator gives a 10 dB overall loss). We have found such a 10 dB overall loss completely satisfactory, and indeed one could accept as little as 8 dB overall loss. Conversely, greater overall loss could be accepted, but this would normally mean that one was either using an over-complex isolator or one was not driving the gain of the second device as hard as one could be. Typically therefore if one had a 30 dB isolator one would push the gain of the second device to 30 dB, if possible.

As a result of our discovery, we realised that it would be possible to mount a small, and hence only modest performance, optical isolator between two laser amplifiers, and to fit the whole assembly into a compact device package. This would facilitate alignment and the control of reflections, hence making such a device cheap and readily manageable.

Figure 1:
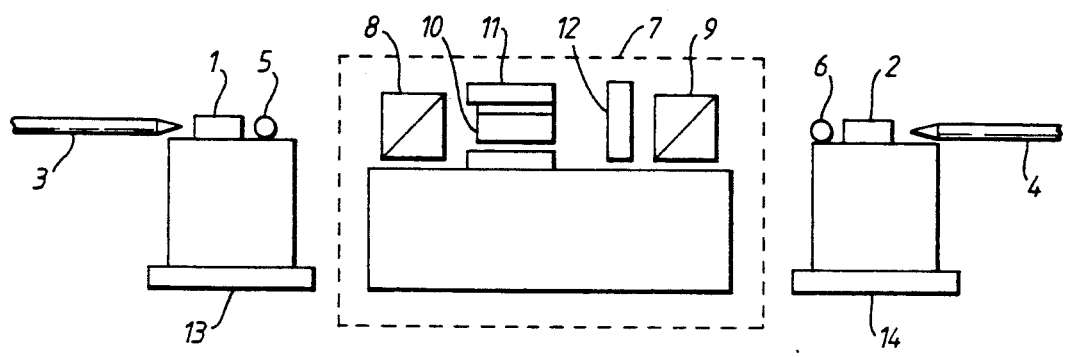
FIG. 1 shows a schematic diagram of an embodiment of the invention.

The system, illustrated schematically in FIG. 1, is based on two 500 $\mu$m long buried heterostructure semiconductor laser amplifiers, 1 and 2, each with a gain peak around 1.5 $\mu$m and with residual facet reflectivities of $2 \times 10^{-3}$. Amplifiers 1 and 2 are arranged in series. Input and output coupling to the system is achieved via anti-reflection coated, tapered lensed ended single mode fibres 3 and 4 with a lens radius of approximately 10 $\mu$m, and a coupling loss of 6 dB composed of 3 dB at the input 3 and 3 dB at the output 4.

The amplifiers are coupled together, via a collimated beam section, with a loss of 6 dB, using two anti-reflection coated, Gadolinium Garnet (GGG) spheres 5 and 6, chosen in this embodiment to have a diameter of 1 mm, which are each placed preferably at a distance of 5 to 10 $\mu$m from one of the amplifier facets. If one or both of the spheres are misaligned the coupling loss will be increased.

A simple miniature optical isolator 7 is placed in the collimated beam section. The optical isolator 7 comprises two dielectric polarising beamsplitter cubes 8 and 9, a YIG Faraday rotator 10 placed in a samarium cobalt magnet 11, and a half wave plate 12 which corrects the net single pass polarisation rotation. The dimensions of these components in this particular embodiment of the invention are preferably chosen to be 3 mm per side of the beamsplitter cubes 8 and 9, a 3 mm diameter YIG Faraday rotator 10, and a 1.5 mm diameter magnet 11.

In this particular embodiment the isolator has an insertion loss of 2 dB and an isolation of 20 dB. This degree of isolation is, surprisingly, sufficient to prevent the backward amplified wave (signal and spontaneous) from the second amplifier affecting the first amplifier. Thus the isolator prevents the system from oscillating, and eliminates crosstalk effects between the signal and amplified reflections.

The two amplifiers 1 and 2 have supports which rest on peltier coolers 13 and 14.

The whole assembly is mounted inside an hermetic package 3 cm long and less than 2 cm wide.

Figure 2:
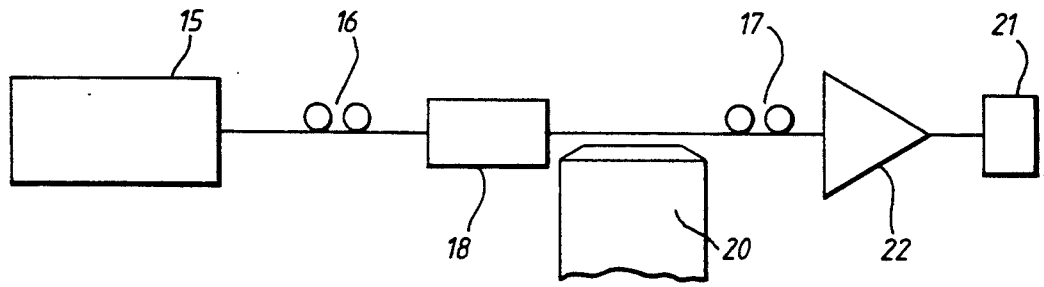
FIG. 2 shows a schematic diagram of an experimental apparatus used for testing the embodiment of the invention shown in FIG. 1.

Tests were carried out on the embodiment of FIG. 1 using apparatus which is schematically illustrated in FIG. 2. The peak gain, gain saturation and gain ripple o the system were measured using a distributed feedback (DFB) laser, emitting at 1.51 $\mu$m, as a transmitter 15. This was connected to the input of the system by polarisation controllers 16 and 17, an optical isolator 18, an optical attenuator and a directional coupler 20 used for monitoring. The receiver 21 connected to the output of the amplifier system or package 22 was PIN diode connected, via a 40 dB amplifier, to an oscilloscope.

The double amplifier package had a "device gain" (input facet to output facet) of 32 dB, or a net gain of 26 dB. The DFB laser was tuned through two residual Fabry-Perot peaks of the amplifier by adjusting the DFB laser operating temperature and the variation in the output power of the package was measured. The input power to the amplifier package was maintained at $-30$ dBm for all temperatures, and thus the gain ripple for 32 dB gain was only 3 dB. The results were obtained with both amplifiers biased at the normal operating current of the devices (40 mA), where a device gain of 21-22 dB per amplifier would be expected with a gain ripple of 3 dB in each device. Since the loss in the package between the amplifiers was 8 DdB it was concluded that the gain saturation of the second amplifier due to the spontaneous emission of the first amplifier was 4 dB.

When the bias on the second amplifier was increased to 55 mA, to overcome the gain saturation, and the amplifiers were retuned (to realign the residual Fabry-Perot modes) the gain was increased by 3 dB. The total gain ripple of the package at the higher gain of 35 dB was 6 dB. The effective reflectivity, derived using a Fabry-Perot analysis, was found to be $2\times10^{-4}$. This reduction of facet reflectivity is a result of using an optical isolator between the two amplifiers. The backward amplified signal from the package was measured to be 20 dB smaller than the forward amplified signal. This is consistent with the effective reflectivity and is a great advantage if the amplifier is to be used in a transmission system requiring more than one repeater.

The tests also determined the gain saturation characteristic of the package. 3 dB gain compression occurs for an input power of $-27$ dBm. This is very similar to the figure for a single amplifier of this type with a gain of 20 dB and would be improved further by using better individual amplifiers than those detailed above. The 3 dB gain compression for a single amplifier with a gain of 35 dB occurs for an input power of $-40$ dBm.

To use the package as a receiver preamplifier the output fibre of the package was then removed and replaced by a lensed photodiode (which was terminated into 50 ohms). The coupling loss to the photodiode was 2 dB so the net gain of the package was now 30 dB. The sensitivity of this receiver was $-35$ dBm at 565 Mbit/s for amplifier gains in excess of 20 dB. This is 3 dB worse than the sensitivity of a similar receiver constructed using a single amplifier and shows that there is no excess noise penalty associated with the use of two amplifiers, since a 3 dB penalty is predicted from the increase in $\Delta$ fl associated with the reduction in effective reflectivity. Insertion of a 3 nm bandpass filter between the second amplifier and the photodiode increased the sensitivity to $-39.5$ dBm. Insertion of a similar filter between the amplifiers (in addition to the isolator) would lead to a further increase in the sensitivity. This particular package was not constructed with such a filter since this would restrict the operating range of a linear repeater and for this application the broadband spontaneous emission noise is less significant.

The increased gain available in this package will enable construction of receivers whose sensitivity is limited by amplifier noise at any bit rate, within the gain bandwidth of the amplifier.

The principal problem with this approach to making a high gain amplifier package is the high polarisation sensitivity of 30 dB due to the use of an optical isolator. Polarisation insensitive amplifiers are now available, however, and by combining them with a polarisation insensitive optical isolator a further improvement to the package should be possible.

The package as described in this embodiment of the invention is a two amplifier package with a gain of 30 dB, an effective reflectivity of $2\times10^{-4}$, a gain ripple of 6 dB, and no noise penalty. One significant advantage of the combination described is that the isolation required is markedly less than that which would have been predicted; only 20 dB being required when it would have been expected to need 40 dB.

This package is ideal for use as a linear repeater since it would reduce the number of repeaters required in a long distance transmission system. With the simple modification described above the package can also be used very successfully as a receiver preamplifier, particularly at high bit rates.

Figure 3:
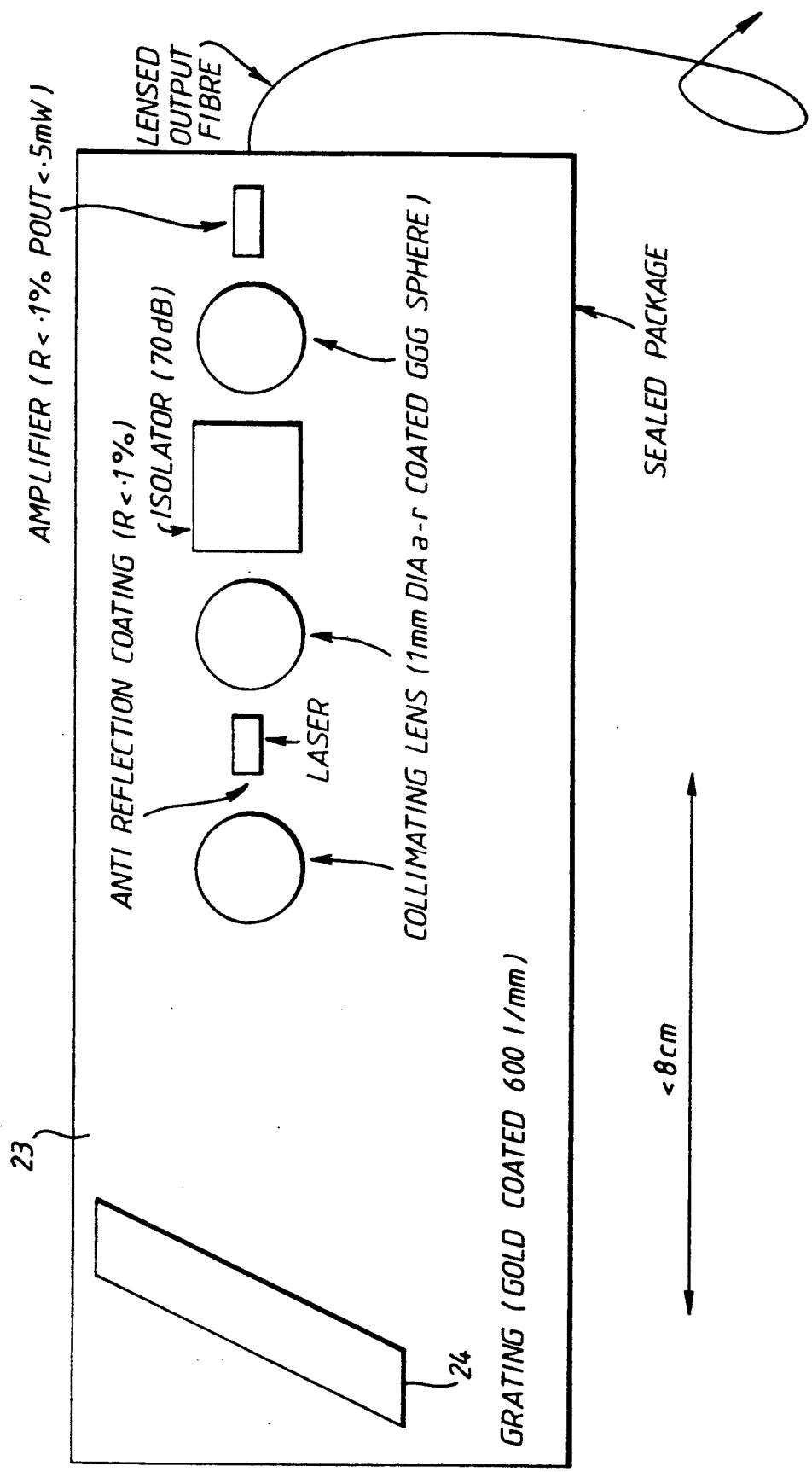
FIG. 3 is a modification of the package of FIG. 1 suitable for generating solitons.

A modification to the package is illustrated schematically in FIG. 3. In this embodiment a first laser amplifier is a mode locked resonant device in a laser assembly 23 with a controlled grating 24 defining an external cavity. Pulses generated by this mode-locked laser arrangement can be made near transform limited to give the narrowest spectrum possible in the time domain, which occurs when $\Delta t \Delta v \approx 0.315$ where $\Delta t$ is the full width half maximum in time and $\Delta v$ is the full width half maximum laser linewidth. The pulses that are generated by the mode locked laser are input to the second laser amplifier and amplified to solitons. For standard single mode fibre the following general values for pulse length, repetition rate and means output power are required to provide solitons.

| Pulse FWHM | Repetition Rate | Mean Power |
| --- | --- | --- |
| 100 ps | 1 GHz | 260 µW |
| 50 ps | 2 GHz | 1.0 mW |
| 20 ps | 5 GHz | 5.6 mW |

Since it is now possible to have a semiconductor laser amplifier with a saturated output power of 10 mW at the output facet it is possible, utilising a double laser amplifier package according to the invention, to generate for example 20 ps solitons at a rate of 5 GHz assuming that the coupling loss into the fibre is less than 3 dB. It is expected that saturated output powers of 20 mW will soon be available and ultimately about 100 mW maximum is possible which would enable 5 ps solitons at 20 GHz which would be of significant practical use.

A more detailed description of FIG. 3 now follows.

The laser chip for the mode locked laser assembly 23 was a 500 µm long buried heterostructure laser with a multilayer anti-reflection coating on one facet. The residual facet reflectivity was $4 \times 10^{-4}$ and the laser had a large signal modulation bandwidth of 1 GHz. The output from the laser chip was coupled into a 8 cm cavity via a 1 mm diameter sphere lens with an output beam diameter of 300 µm. The grating 4 was a 600 line/mm ruled grating blazed for 1.6 µm and gold coated. The feedback bandwidth from the grating was 300 GHz (the resolution of the grating for a 300 µm beam) and the dispersion due to the grating angle was 0.5 ps.

The laser was actively mode locked by superimposing a sine wave (in the frequency range 500 MHz to 20 GHz) on a 25 mA dc bias. When the mode-locking was optimised the output of this laser consisted of a train of near transform limited 1.5 ps pulses (with a time bandwidth product of 0.35) at a repetition frequency of 1.6 GHz which could be tuned over 230 nm. The pulses could be reproduced at cavity harmonic frequencies up to 8 GHz by harmonic mode locking. Near transform limited pulses with widths of less than 20 ps could be obtained over a bandwidth of 110 nm. The output pulses were measured using a streak camera with time resolution of 2 ps and had a minimum measured width of 2.5 ps. The pulse spectra were measured using a monochromator and had a maximum width of 1.9 nm. The laser was tuned to emit at 1.52 µm and the pulses were transmitted via an optical isolator (60 dB) and 10 m of fibre (with a dispersion of 0.2 ps) to an optical amplifier.

In an alternative construction, illustrated in FIG. 3, the output of the isolator was fed directly, that is without the aid of a fibre, into an optical amplifier.

The amplifier was a 500 µlong buried heterostructure chip with multilayer anti-reflection coatings on both facets. The residual facet reflectivity was $8 \times 10^{-4}$ and the gain ripple at the operating current of 100 mA was 3 dB with a device gain of 25 dB. The material dispersion of the chip (derived from the emission spectrum) was 0.05 ps. Output coupling was achieved using ground tapered lens ended fibres and, where a similar fibre was used to couple into the amplifier, the total coupling loss was 9 dB. The maximum mean input power to the amplifier was −16 dBm at the facet and this resulted in a 3 dB reduction in gain from the unsaturated gain of 25 dB. The output of the amplifier was measured on a streak camera and a monochromator. The results, for an input power of −16 dBm, showed that the pulse has suffered no spectral shift or distortion and only a slight broadening consistent with the dispersion of the measurement system was observed even though the amplifier gain is saturated. The gain and gain saturation were found to be independent of the pulse repetition frequency at all available frequencies up to 8 GHz. The gain recovery time of the amplifier was estimated to be 500 ps by measuring the amplitude compression of secondary pulses (which could be obtained from the mode locked laser when the operating conditions were not optimised) after amplification.

The means input power required for 3 dB gain compression at the gain peak (1.5 µm) was −19 dBm (at the facet) and the mean input power required for 3 dB gain compression at 1:52 µm was −16 dBm. The maximum average output power of the amplifier was 2 mW. This could have been increased by increasing the input power but pulse distortion due to gain saturation would occur. However in order to transmit 1.5 ps pulses over an appreciable distance fibre dispersion must be compensated for, possibly by using soliton effects, for which the output power would need to be 26 mW with a 1.6 GHz repetition frequency. This demonstrates that the semiconductor laser amplifier has sufficient bandwidth to be useful in any conceivable linear optical communication system but development of high output power amplifiers is required in order to maximise its potential for use in non-linear systems.

An alternative tot he mode locked laser arrangement shown in FIG. 3 would be to use a gain switched DFB laser. Such a source would not provide transform limited pulses, but by utilising a non-linear amplifier for the second laser amplifier, pulse compression to transform limited pulses can be achieved, along with amplification, in the second amplifier. Pulse compression may be achieved in two ways, one way is to chop the front end of the pulse by having for example a two element amplifier with a saturable absorber element that absorbs the front part of the pulse and transmits the rest of the pulse after it reaches saturation. Alternatively the back end of the pulse may be chopped off by using gain saturation in which the carriers are depleted by the first part of the pulse so that the latter part of the pulse is not transmitted. A gain switched DFB laser is less sensitive to feedback than an LEC laser and the isolation between the two laser amplifiers may therefore be reduced possible to of the order of 40 dB.

Having achieved a stream of soliton pulses it is, in order to utilise them for data transmission, necessary to modulate the pulses with data. This is also the case for non-soliton pulse streams that may be generated using a package similar to that in FIGS. 1 or 3. In the present invention it is envisaged that modulation can be achieved by modulating the bias on the second amplifier. If the bias is turned on and off at a rate of up to 2 GHz then pulses will be correspondingly turned off and on. However if a higher bias switching rate is used, for example 10 GHz, then the amplifier does not fully turn off and the result is a ripple on the gain pulse, a typical loss being 3 dB for the 'off' pulses. The modulated pulses may then be further processed to eliminate the lower intensity pulses. If the laser amplifiers are set to produce solitons then the 3 dB loss for the 'off' pulses will reduce their power below soliton level and the pulse train may be filtered through a soliton loop mirror switch so that only soliton pulses and zero intervals (corresponding to the switched out lower intensity pulses) are launched into the fibre.

In both the first and the second embodiments, modulation t the second laser amplifier may also be used to provide a supervisory or response channel, for example incoming data pulses to the first laser amplifier of the package of FIG. 1 may be read (e.g. by monitoring the voltage over the device) and a modulation imposed at the second amplifier indicative of the fact that the data has been read.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

I claim:

1. A laser amplifier package comprising:
   first and second semiconductor laser amplifiers, and an optical isolator,
   the output of the first laser amplifier being applied to the second laser amplifier via a collimated beam section constituted by two lenses, and
   the optical isolator being positioned between the two lenses,
   wherein the isolation factor of the optical isolator is dependent upon the gain of the second laser amplifier.

2. A laser amplifier package as claimed in claim 1, wherein the first laser amplifier is driven as an optical pulse source.

3. A laser amplifier as claimed in claim 2, wherein the first laser amplifier constitutes part of an LEC laser assembly.

4. A laser amplifier package as claimed in claim 1, wherein the isolation factor of the optical isolator is not more than 30 dB.

5. A laser amplifier package as claimed in claim 1, wherein the optical isolator has an isolation factor such that the round trip signal loss for a signal, which passes in the forward direction through the second laser amplifier, is reflected by a remote facet included therein, is passed through the second laser amplifier in the reverse direction, and is passed through the optical isolator, is between 8 dB and 15 B.

6. A laser amplifier package as claimed in claim 1, wherein the isolator is constituted by a Faraday rotator positioned between two dielectric polarising beamsplitter cubs.

7. A laser amplifier package as claimed in claim 1, wherein the second laser amplifier is a non-linear amplifier which is such as to compress the output of the first laser amplifier to near transform limited pulses.

8. A laser amplifier package as claimed in claim 7, further comprising a modulator for modulating the bias on the second laser amplifier.

9. A laser amplifier package as claimed in claim 8, wherein the modulator is such as to alternate the bias on the second laser amplifier between on and off.

10. A laser amplifier package as claimed in claim 8, wherein the modulator is such that the second laser amplifier is switched at a rate such that it is not fully turned off.

11. A laser amplifier package as claimed in claim 9, further comprising means for filtering lower intensity pulses output from the second laser amplifier when the second laser amplifier is switched off.

12. A method of amplifying an optical pulse the method comprising:
   supplying an input optical pulse via an optical fibre to a sealed package comprising first and second semiconductor laser amplifiers arranged in series,
   amplifying the input optical pulse in the first laser amplifier,
   feeding the resultant amplified optical pulse from the output of the first laser amplifier into the second laser amplifier,
   further amplifying the optical pulse in the second laser amplifier, and
   outputting via an optical fibre the resultant further amplified optical pulse,
   wherein an optical isolator is provided between the first laser amplifier, the optical isolator having an isolation factor which is dependent upon the gain of the second laser amplifier.

13. A method as claimed in claim 12, wherein the isolation factor of the optical isolator is such that the round trip signal loss for a signal, which passes in the forward direction through the second laser amplifier, is reflected by a remote facet included therein, is passed through the second laser amplifier in the reverse direction, and is passed through the optical isolator, is between 8 and 15 dB.

14. A soliton generator comprising:
   a semiconductor laser,
   a semiconductor laser amplifier, and
   an optical isolator,
   the output of the laser being applied to the input of the laser amplifier by a collimated beam section constituted by two lenses, and
   the optical isolator being positioned between the two lenses,
   wherein the generator is such that the laser amplifier amplifies near transform limited pulses to optical solitons.

15. A soliton generator as claimed in claim 14, wherein the laser is driven as an optical pulse source.

16. A soliton generator, as claimed in claim 14, wherein the laser constitutes part of an LEC laser assembly.

17. A soliton generator as claimed in claim 15, wherein the laser is actively mode locked so that pulses from the LEC laser assembly are near transform limited.

18. A soliton generator as claimed in claim 14, wherein the laser is a gain switched DFB laser.

19. A soliton generator as claimed in claim 17, wherein the laser amplifier is a non-linear which is such as to compress the pulses from the gain switched DFB laser to near transform limited pulses.

20. A soliton generator as claimed in claim 14, further comprising a modulator for modulating the bias on the laser amplifier.

21. A soliton generator as claimed in claim 20, wherein the modulator is such as to alternate the bias on the laser amplifier between on and off.

22. A soliton generator as claimed in claim 20, wherein the modulator is such that the laser amplifier is switched at a rate such that it is not fully turned off.

23. A soliton generator as claimed in claim 21, further comprising means for filtering lower intensity pulses output from the laser amplifier when the modulator is such that the bias on the laser amplifier is switched off.

* * * * *